(12) United States Patent
Guo et al.

(10) Patent No.: US 8,802,482 B2
(45) Date of Patent: Aug. 12, 2014

(54) METHOD TO FABRICATE MULTICRYSTAL SOLAR CELL WITH LIGHT TRAPPING SURFACE USING NANOPORE COPOLYMER

(75) Inventors: Dechao Guo, Fishkill, NY (US); Zhengwen Li, Danbury, CT (US); Kejia Wang, Poughkeepsie, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 13/289,324

(22) Filed: Nov. 4, 2011

(65) Prior Publication Data
US 2013/0115732 A1 May 9, 2013

(51) Int. Cl.
*H01L 21/00* (2006.01)
(52) U.S. Cl.
USPC ............................................ 438/71; 438/781
(58) Field of Classification Search
USPC ................. 438/780–781, 69–72, 96–97
See application file for complete search history.

(56) References Cited

U.S. PATENT DOCUMENTS

| | | | |
|---|---|---|---|
| 6,565,763 B1 | 5/2003 | Asakawa et al. |
| 7,563,722 B2 | 7/2009 | Yaniv et al. |
| 7,651,735 B2 | 1/2010 | Cheng et al. |
| 7,709,079 B2 | 5/2010 | Black et al. |
| 2008/0041815 A1 | 2/2008 | Li et al. |
| 2008/0143906 A1 | 6/2008 | Allemand et al. |
| 2008/0176767 A1 | 7/2008 | Millward |
| 2008/0264483 A1 | 10/2008 | Keshner et al. |
| 2009/0071537 A1 | 3/2009 | Yavuzcetin et al. |
| 2009/0107953 A1 | 4/2009 | Cheng et al. |
| 2009/0266418 A1 | 10/2009 | Hu et al. |
| 2010/0112308 A1 | 5/2010 | Russell et al. |

OTHER PUBLICATIONS

Ana-Maria Popa et al., "Fabrication of nanopore arrays and ultrathin silicon nitride membranes by block-copolymer assisted lithography," Nanotechnology, vol. 20, No. 48 (Oct. 2009).
V. Sudha Rani et al., "Ultra high density nanopore arrays using self assembled diblock copolymer," Journal of Optoelectronics and advanced materials, vol. 10, No. 7 p. 1877-1880 (Jul. 2008).
C.T. Black et al., "Integration of self-assembled diblock copolymers for semiconductor capacitor fabrication," Applied Physics Letters, vol. 79, No. 3, pp. 409-411 (Jul. 2001).
A.R. Burgers et al., "Light-Trapping in Saw-Damage Etched Silicon Wafers," Proc. 14th European Photovoltaic Solar Energy Conf., 1997, pp. 143-146.
Deparis et al., "Optimization of photonics for corrugated thin-film solar cells," Journal of Applied Physics vol. 106, 094505-1-094505-9 (2009).
Park et al., "High-Aspect-Ratio Cylindrical Nanopore Arrays and Their Use for Templating Titania Nanoposts," Advanced Materials, vol. 20, No. 4, 2008, pp. 738-742.
Santbergen et al., "An Optical Model for the Absorption Factor of Textured Crystalline Silicon PV Cells," 21st European Photovoltaic Solar Energy Conference, Sep. 4-8, 2006, Dresden, Germany, pp. 416-421.

*Primary Examiner* — Richard Booth
(74) *Attorney, Agent, or Firm* — Vazken Alexanian; Michael J. Chang, LLC

(57) ABSTRACT

Multi-crystalline silicon processing techniques are provided. In one aspect, a method for roughening a multi-crystalline silicon surface is provided. The method includes the following steps. The multi-crystalline silicon surface is coated with a diblock copolymer. The diblock copolymer is annealed to form nanopores therein. The multi-crystalline silicon surface is etched through the nanopores in the diblock copolymer to roughen the multi-crystalline silicon surface. The diblock copolymer is removed. A multi-crystalline silicon substrate with a roughened surface having a plurality of peaks and troughs is also provided, wherein a distance from one peak to an adjacent peak on the roughened surface is from about 20 nm to about 400 nm.

20 Claims, 6 Drawing Sheets

US 8,802,482 B2

METHOD TO FABRICATE MULTICRYSTAL SOLAR CELL WITH LIGHT TRAPPING SURFACE USING NANOPORE COPOLYMER

FIELD OF THE INVENTION

The present invention relates to multi-crystalline silicon processing techniques and more particularly, to techniques for processing multi-crystalline silicon using a nanopore copolymer and solar cells fabricated using multi-crystalline silicon processed in this manner.

BACKGROUND OF THE INVENTION

A typical solar cell includes a heterojunction formed between two silicon layers, a p-doped base and an n-doped emitter layer. An antireflection coating is generally present on top of the emitter layer, so as to enhance trapping of incident light by preventing the light from begin reflected off of the surface of the solar cell.

Multi-crystalline silicon is often used to form the base and emitter layer. In such multi-crystalline silicon solar cells, it is desirable to achieve good light trapping properties by processing the surface of the multi-crystalline silicon such that when the antireflection coating is deposited thereon (the antireflection coating is a conformal layer) a roughened, and thus enhanced light trapping, surface results.

Due to the fact that the surface of multi-crystalline silicon is isotropic in front of acid or alkaline, wet etch without patterning could not create required surface roughness to provide good light trapping property. Patterning and reactive ion etching (RIE) processes can be used, in theory, to achieve the above goal. However, from a practical standpoint, the costs associated with the RIE approach are prohibitively high.

Therefore, effective, low-cost solutions for multi-crystalline silicon processing to achieve the above-described results, would be desirable.

SUMMARY OF THE INVENTION

The present invention provides multi-crystalline silicon processing techniques. In one aspect of the invention, a method for roughening a multi-crystalline silicon surface is provided. The method includes the following steps. The multi-crystalline silicon surface is coated with a diblock copolymer. The diblock copolymer is annealed to form nanopores therein. The multi-crystalline silicon surface is etched through the nanopores in the diblock copolymer to roughen the multi-crystalline silicon surface. The diblock copolymer is removed.

In another aspect of the invention, a method for fabricating a solar cell is provided. The method includes the following steps. A multi-crystalline silicon substrate is provided. A surface of the multi-crystalline silicon substrate is coated with a diblock copolymer. The diblock copolymer is annealed to form nanopores therein. The surface of the multi-crystalline silicon substrate is etched through the nanopores in the diblock copolymer resulting in a roughened surface. The diblock copolymer is removed. A conformal emitter layer is formed on the roughened surface of the multi-crystalline silicon substrate. A conformal antireflection coating is formed on the emitter layer.

In yet another aspect of the invention, a multi-crystalline silicon substrate with a roughened surface having a plurality of peaks and troughs is provided. A distance from one peak to an adjacent peak on the roughened surface is from about 20 nm to about 400 nm.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for roughening the surface of a multi-crystalline silicon layer using a nanopore copolymer. The present techniques are applicable to the fabrication of multi-crystalline silicon solar cells. FIGS. 1-8 illustrate one exemplary embodiment wherein a single nanopore copolymer layer is used to roughen the surface of a multi-crystalline silicon layer. FIGS. 9-14 illustrate another exemplary embodiment, wherein multiple nanopore copolymer layers are used in combination. Employing multiple nanopore copolymer layers can be used to decrease the nanopore density and thereby vary the surface roughness achieved.

Figure 1:
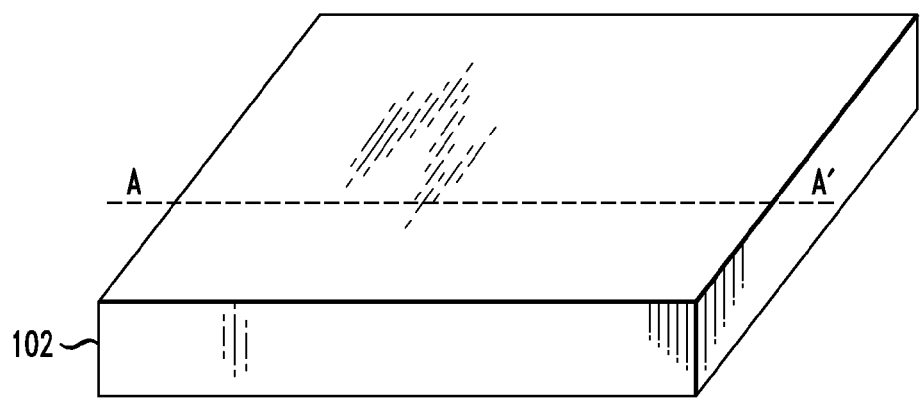
FIG. 1 is a three-dimensional diagram illustrating a multi-crystalline silicon layer according to an embodiment of the present invention.

FIG. 1 is a three-dimensional diagram illustrating a multi-crystalline silicon layer 102. The present techniques are applicable to any fabrication process involving the roughening of a multi-crystalline silicon surface.

As will be described in detail below, multi-crystalline silicon layer 102 may be a bulk base material of a solar cell. In that instance, there may exist other components beneath multi-crystalline silicon layer 102, such as a bottom electrode. See, for example, FIG. 17, described below. However, for ease and clarity of depiction of the overall process, multi-crystalline silicon layer 102 is used as the starting point in this embodiment.

Figure 2:
FIG. 2 is a diagram illustrating a cross-sectional cut through the multi-crystalline silicon layer of FIG. 1 according to an embodiment of the present invention.
Figure 3:
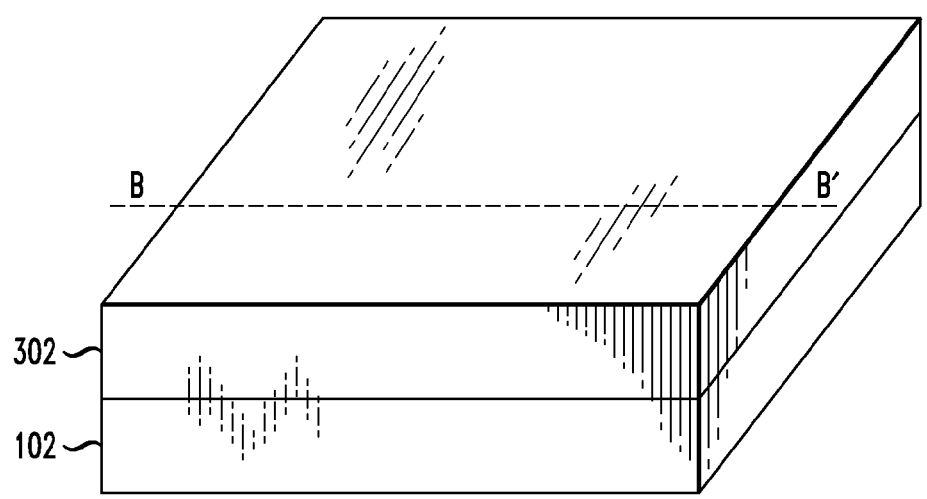
FIG. 3 is a three-dimensional diagram illustrating the multi-crystalline silicon layer having been coated with a diblock copolymer according to an embodiment of the present invention.

FIG. 2 depicts a cross-sectional cut through multi-crystalline silicon layer 102, e.g., along line A-A' (of FIG. 1). Throughout the description, both top-down three-dimensional views and cross-sectional cuts will be used to illustrate the present techniques.

Next, multi-crystalline silicon layer 102 is coated with a diblock copolymer 302. See FIG. 3. According to an exemplary embodiment, the diblock copolymer is deposited on multi-crystalline silicon layer 102 using a spin-coating process. Suitable diblock copolymers include, but are not limited to, Polystyrene-b-poly(ethylene oxide), PS-b-PEO, Polystyrene-poly(methyl methacrylate) and/or PS-b-PMMA.

Figure 4:
FIG. 4 is a diagram illustrating a cross-sectional cut through the diblock copolymer and multi-crystalline silicon layer of FIG. 3 according to an embodiment of the present invention.

According to an exemplary embodiment, the diblock copolymer 302 is spin-coated onto multi-crystalline silicon layer 102 (i.e., so as to form a self-aligned layer/film) to a thickness of from about 20 nanometers (nm) to about 80 nm, e.g., from about 40 nm to about 60 nm. The diblock copolymer 302 can be spin-coated onto the multi-crystalline silicon layer 102 at a speed of from about 800 revolutions per minute (RPM) to about 1,000 RPM to attain adequate coverage. However, as will be described in detail below, the speed at which the spin-on coating is conducted can be varied to vary the characteristics of the diblock copolymer. FIG. 4 depicts a cross-sectional cut through diblock copolymer 302 and multi-crystalline silicon layer 102, e.g., along line B-B' (of FIG. 3).

The diblock copolymer will serve as a template or mask through which an etch will be used to roughen the surface of the multi-crystalline silicon layer 102. In order to do so, nanopores are first formed in the diblock copolymer 302. See FIG. 5 which illustrates an array of nanopores 502 having been formed in diblock copolymer 302.

According to an exemplary embodiment, nanopores 502 are formed by annealing the diblock copolymer 302 at a temperature of from about 150 degrees Celsius (° C.) to about 240° C. for a duration of greater than or equal to about 24 hours, e.g., from about 24 hours to about 48 hours. The surface of the diblock copolymer 302 can then be rinsed, e.g., in toluene, to remove unattached chains.

By way of example only, the nanopores 502 formed in this manner in the diblock copolymer 302 will have a spacing x (i.e., between adjacent nanopores) of from about 20 nm to about 40 nm. See FIG. 6. Since the diblock copolymer will serve as a template for the roughening etch (to be performed below), the nanopore spacing will translate to a certain amount of roughness on the surface of multi-crystalline silicon layer 102. The surface roughness is determined by nanopore diameter (d in FIG. 6) and nanopore spacing (x in FIG. 6). By way of example only, at a given nanopore diameter d, having a smaller x indicates a higher density of nanopores 502, thus more surface roughness. As will be described in detail below, one or more additional diblock copolymer layers can be used to increase the nanopore spacing x and thereby decrease the surface roughness of multi-crystalline silicon layer 102.

The term 'nanopore' as used herein refers generally to pores (i.e., holes or openings in the diblock copolymer 302) having a diameter d of from about 6 nm to about 40 nm, e.g., from about 10 nm to about 30 nm. See FIG. 6.

Further, as highlighted above, the speed of the spin-on process used to coat the diblock copolymer on the multi-crystalline silicon layer surface can affect the copolymer characteristics. Other processing conditions can also affect the nanopore density.

Nanopore density is a measure of the number of nanopores in a given area. As described above, the number of nanopores in a given area is dependent both on the nanopore diameter and the nanopore spacing, e.g., for a given nanopore diameter a decrease in nanopore spacing results in an increase in nanopore density.

Methods for fabricating arrays of nanopores in block-copolymer monolayers including techniques for altering the dimensions of the nanopores, e.g., such as the diameters, interspacing and aspect ratios of the nanopores is described, for example in, Ana-Maria et al., "Fabrication of nanopore arrays and ultrathin silicon nitride membranes by block-copolymer assisted lithography," Nanotechnology, vol. 20, Number 48 (2009), the contents of which are incorporated by reference herein. See also, V. Sudha Rani et al., "Ultra high density nanopore arrays using self assembled diblock copolymer," Journal of Optoelectronics and advanced materials, vol. 10, No. 7 p. 1877-1880 (July 2008), the contents of which are incorporated by reference herein, which describes how the spin speed and polymer concentration account for a thickness of the film, while factors such as the molecular weights of the polymer blocks and the annealing time determine the pore formation and density.

Figure 5:
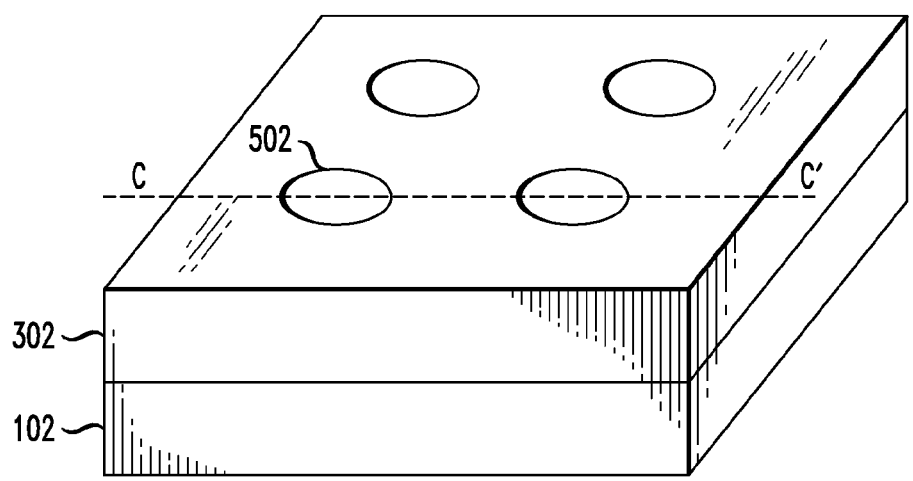
FIG. 5 is a three-dimensional diagram illustrating an array of nanopores having been formed in the diblock copolymer according to an embodiment of the present invention.
Figure 6:
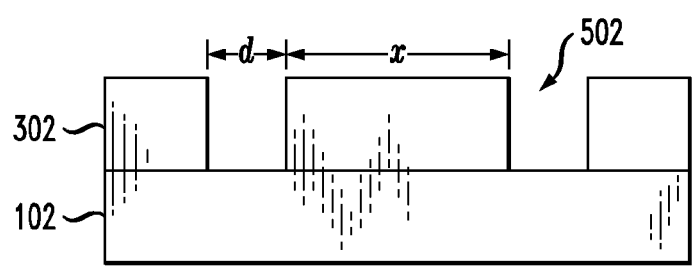
FIG. 6 is a diagram illustrating a cross-sectional cut through the diblock copolymer/nanopores and multi-crystalline silicon layer according to an embodiment of the present invention.

FIG. 6 depicts a cross-sectional cut through diblock copolymer 302/nanopores 502 and multi-crystalline silicon layer 102, e.g., along line C-C' (of FIG. 5). As shown in FIG. 6, nanopores 502 extend through the diblock copolymer 302 down to the surface of multi-crystalline silicon layer 102.

A wet etch process, using for example acid or alkaline, can then be performed through the nanopores 502 in the diblock copolymer 302 in order to etch the surface of multi-crystalline silicon layer 102. According to an exemplary embodiment, an acid etch is performed using a $HF:HNO_3:H_2O$ solution. The solution ratio and etching time can control the etch amount of multi-crystalline silicon. By way of example only, concentrations of the acid $HF:HNO_3:H_2O$ solution can range from 1:1:10 to 1:1:1, and soak times vary depending on the thickness of the film. One of ordinary skill in the art would be able to ascertain the soak time based on a given film thickness.

Once the etch is completed, the diblock copolymer 302 can also be removed in this step. According to an exemplary embodiment, the diblock copolymer 302 is removed using a two step removal process. In the first step, the assembly is exposed to a downstream hydrogen ($H_2$) or forming gas plasma for a length of time of from about 30 seconds to about two minutes at a temperature of from about 75° C. to about 100° C. so as to weaken the diblock copolymer 302 to make the diblock copolymer 302 more hydrophilic. In the second step, a wet etch is performed with standard SC1 ($H_2O:H_2O_2$: $NH_4OH$ in volume ratio of from about 5:1:1 to about 7:2:1) for a duration of from about two minutes to about five minutes at either room temperature or at a temperature of from about 50° C. to about 75° C. Alternatively, in the second step, supercritical carbon dioxide ($CO_2$) can be used (with or without a co-solvent, such as five percent (%) toluene) to dissolve or cause a swelling of the weakened copolymer and to detach/remove the diblock copolymer 302. See FIG. 7.

Figure 7:
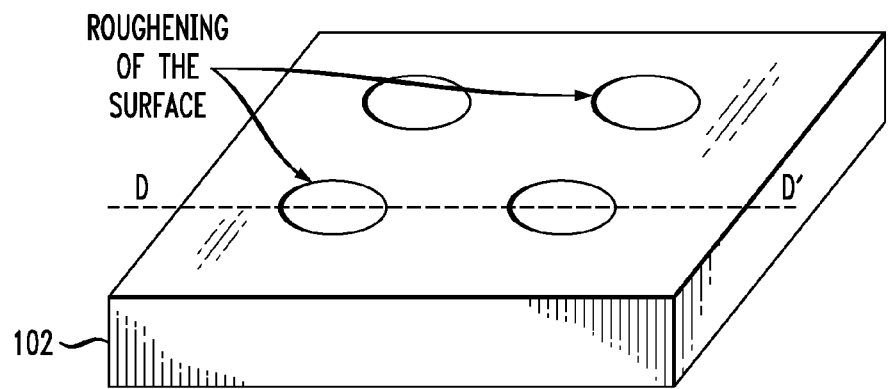
FIG. 7 is a three-dimensional diagram illustrating a wet etch process having been performed through the nanopores in the diblock copolymer to roughen the surface of the multi-crystalline silicon layer and the diblock copolymer having been removed according to an embodiment of the present invention.
Figure 8:
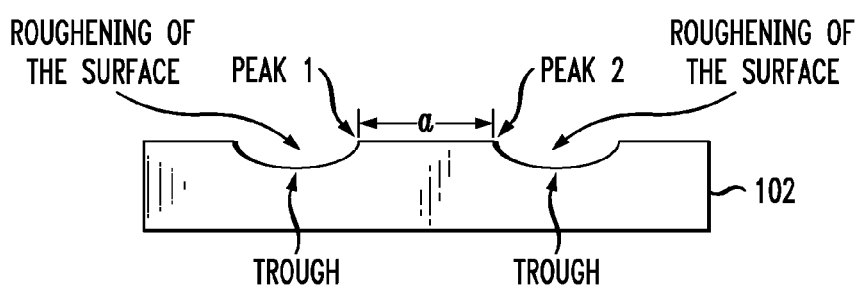
FIG. 8 is a diagram illustrating a cross-sectional cut through the multi-crystalline silicon layer which has now been roughened according to an embodiment of the present invention.

FIG. 8 depicts a cross-sectional cut through a now-roughened multi-crystalline silicon layer 102, e.g., along line D-D' (of FIG. 7). As shown in FIG. 8, the roughening corresponds to the nanopore spacing depicted, for example, in FIG. 6. Namely, the surface roughness shown in FIG. 8 is merely exemplary and is intended to illustrate the present techniques.

As described above, the surface roughness produced by the process depends, for example, on the particular nanopore diameter (d in FIG. 6) and nanopore spacing (x in FIG. 6). For instance, at a given nanopore diameter d, having a smaller x indicates a higher density of nanopores, thus more surface roughness. As shown in FIG. 8, the surface roughness produced using the present techniques (e.g., a wet etch having been performed through the nanopores 502 in the diblock copolymer 302) results in a plurality of peaks and troughs having been formed on the surface of the multi-crystalline silicon layer 102. These peaks and troughs are what collectively create the surface roughness on the multi-crystalline silicon layer 102. By way of example only, according to an exemplary embodiment, a distance from one peak to an adjacent peak on the "roughened" surface is from about 20 nm to about 400 nm. The surface roughness corresponds to the nanopore diameter and spacing. Accordingly, a distance a from one peak (e.g., Peak 1) to an adjacent peak (e.g., Peak 2) corresponds to the nanopore spacing x. See FIG. 8. Thus according to an exemplary embodiment, the distance a from one peak to an adjacent peak on the roughened surface of the multi-crystalline silicon layer 102 is from about 20 nm to about 40 nm. As highlighted above, the surface roughness can be altered by increasing/decreasing the nanopore density. Accordingly, this will increase/decrease the peak-to-peak distance, see below.

While, as highlighted above, the processing conditions can be varied to vary the nanopore density, the amount of nanopore density variation that can be achieved in a single diblock copolymer layer is however limited. Advantageously, by way of the present teachings it has been found that multiple diblock copolymer layers can be used in combination with one another to further vary the nanopore density.

Namely, as will be described in detail below, by stacking nanopore diblock copolymer layers on one another, the effective nanopore density (for the purposes of etching the multi-crystalline silicon layer) will be limited to those pores that line up through the various diblock copolymer layers and down to the multi-crystalline silicon layer surface. This embodiment will now be described.

The preliminary steps for this embodiment are the same as illustrated in FIGS. 1-6, described above, wherein a diblock copolymer is spin-coated on a multi-crystalline silicon layer and annealed to form nanopores therein. That description is incorporated by reference herein. The resulting structure is shown in FIG. 9, wherein a multi-crystalline silicon layer 902 has a diblock copolymer 904 coated thereon.

Nanopores 906 are present in diblock copolymer 904. As described above, the nanopores 906 may be formed in the diblock copolymer 904 by annealing the diblock copolymer 904 at a temperature of from about 150° C. to about 240° C. for a duration of greater than or equal to about 24 hours, e.g., from about 24 hours to about 48 hours. Following the anneal, the surface of the diblock copolymer 904 can then be rinsed, e.g., in toluene, to remove unattached chains.

Figure 9:
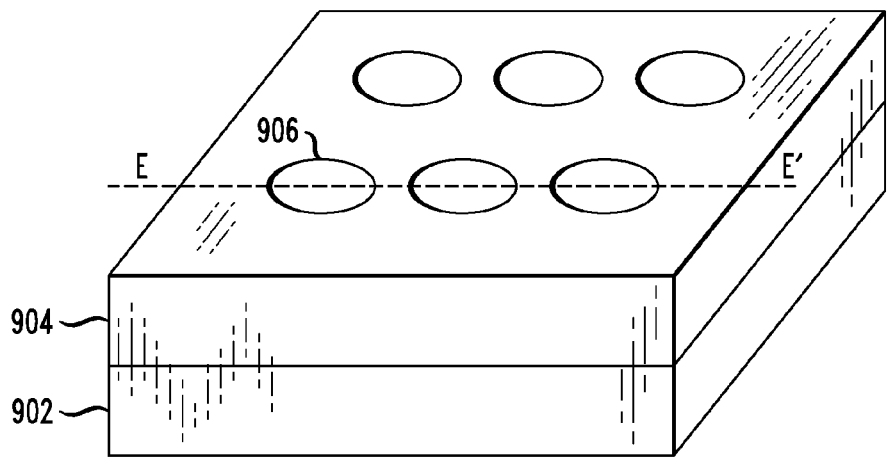
FIG. 9 is a three-dimensional diagram illustrating a multi-crystalline silicon layer having a first diblock copolymer coated thereon and nanopores within the diblock copolymer according to an embodiment of the present invention.
Figure 10:
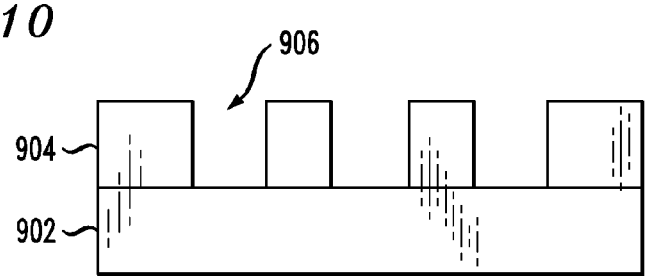
FIG. 10 is a diagram illustrating a cross-sectional cut through the diblock copolymer/nanopores and multi-crystalline silicon layer according to an embodiment of the present invention.

FIG. 10 depicts a cross-sectional cut through diblock copolymer 904/nanopores 906 and multi-crystalline silicon layer 902, e.g., along line E-E' (of FIG. 9). As shown in FIG. 10, nanopores 906 extend through the diblock copolymer 904 down to the surface of multi-crystalline silicon layer 902.

Next, a second diblock copolymer is spin-coated on the first diblock copolymer, i.e., a diblock copolymer 1102 is spin-coated on the diblock copolymer 904. As highlighted above, the diblock copolymer 1102 is spin-coated onto the diblock copolymer 904 (i.e., so as to form a self-aligned layer/film) to a thickness of from about 20 nm to about 80 nm, e.g., from about 40 nm to about 60 nm. The diblock copolymer 1102 can be spin-coated onto the diblock copolymer 904 at a speed of from about 800 RPM to about 1,000 RPM to attain adequate coverage. Further, as described above, the speed of the spin-on process used to coat the diblock copolymer can affect the copolymer characteristics. Other processing conditions can also affect the nanopore density. The second diblock copolymer 1102 is then annealed (e.g., at a temperature of from about 150° C. to about 240° C. for a duration of greater than or equal to about 24 hours, e.g., from about 24 hours to about 48 hours) to form nanopores 1104 therein. See FIG. 11. Following the anneal, the surface of the diblock copolymer 1102 can then be rinsed, e.g., in toluene, to remove unattached chains.

An etch through the nanopores in these stacked diblock copolymer layers will be used to roughen the surface of multi-crystalline silicon layer 902 (on which the diblock copolymer layers are stacked). Thus, the etch will only permeate those nanopores that extend through all of the diblock copolymer layers. See FIG. 12.

Thus, effectively, the spacing y between these 'through-extending' nanopores is increased as compared with the spacing in the single diblock copolymer example provided above. This is because only a fraction of the nanopores in each of the diblock copolymer layers will line up with the nanopores in the other diblock copolymer layer(s). Increasing the number of diblock copolymer layers increases the nanopore spacing, and the number of layers employed can be varied accordingly. For ease of depiction, only two diblock copolymer layers are being shown here, with the understanding that more layers could be employed, if so desired, to further increase the nanopore spacing.

Figure 11:
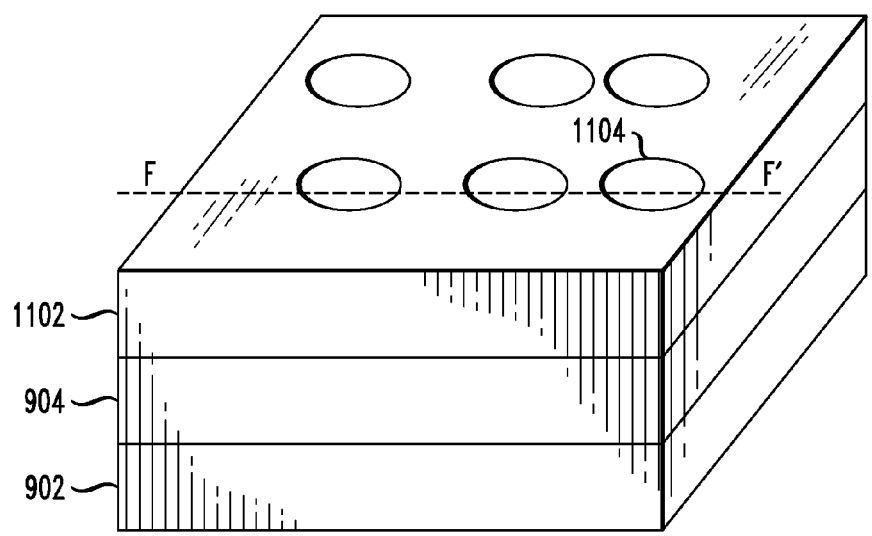
FIG. 11 is a three-dimensional diagram illustrating a second diblock copolymer having been coated on the first diblock copolymer and nanopores having been formed in the second diblock copolymer according to an embodiment of the present invention.
Figure 12:
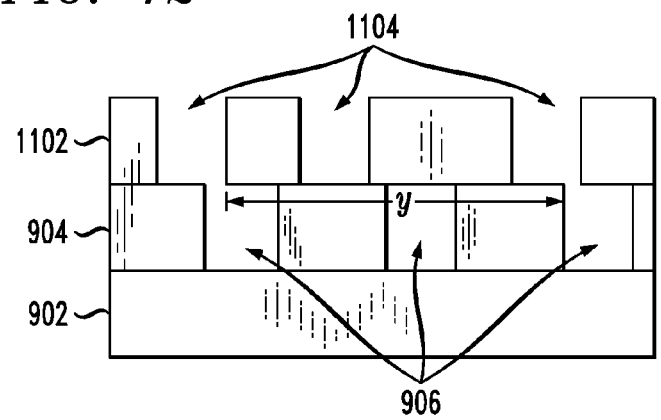
FIG. 12 is a diagram illustrating a cross-sectional cut through the first and second diblock copolymers and the nanopores therein and the multi-crystalline silicon layer according to an embodiment of the present invention.

FIG. 12 depicts a cross-sectional cut through diblock copolymer 904 and 1102/nanopores 906 and 1104 and multi-crystalline silicon layer 902, e.g., along line F-F' (of FIG. 11). As shown in FIG. 12, not all of the nanopores 906 in the first diblock copolymer 904 line up with the nanopores 1104 in the second diblock copolymer 1102. Thus, the spacing between nanopores in this instance would be greater than if either the diblock copolymer 904 or 1102 were used alone. The use of multiple diblock copolymer layers can result in nanopore spacing y of, for example, from about 80 nm to about 400 nm, e.g., from about 100 nm to about 300 nm.

A wet etch process, using for example acid or alkaline as described above, can then be performed through the nanopores in order to etch the surface of the multi-crystalline silicon layer 902. As described above, an acid etch may be performed using a $HF:HNO_3:H_2O$ solution. By way of example only, concentrations of the acid $HF:HNO_3:H_2O$ solution can range from 1:1:10 to 1:1:1, and soak times vary depending on the thickness of the film. One of ordinary skill in the art would be able to ascertain the soak time based on a given film thickness.

Once the etch is completed, the diblock copolymer layers 904 and 1102 can also be removed in this step. As described above, the diblock copolymers 904 and 1102 are removed using a two step removal process. In the first step, the assembly is exposed to a downstream hydrogen ($H_2$) or forming gas plasma for a length of time of from about 30 seconds to about two minutes at a temperature of from about 75° C. to about 100° C. so as to weaken the diblock copolymers 904 and 1102 to make the diblock copolymers 904 and 1102 more hydrophilic. In the second step, a wet etch is performed with standard SC1 ($H_2O:H_2O_2:NH_4OH$ in volume ratio of from about 5:1:1 to about 7:2:1) for a duration of from about two minutes to about five minutes at either room temperature or at a temperature of from about 50° C. to about 75° C. Alternatively, in the second step, supercritical carbon dioxide ($CO_2$) can be used (with or without a co-solvent, such as five % toluene) to dissolve or cause a swelling of the weakened copolymer and to detach/remove the diblock copolymers 904 and 1102. See FIG. 13.

Figure 13:
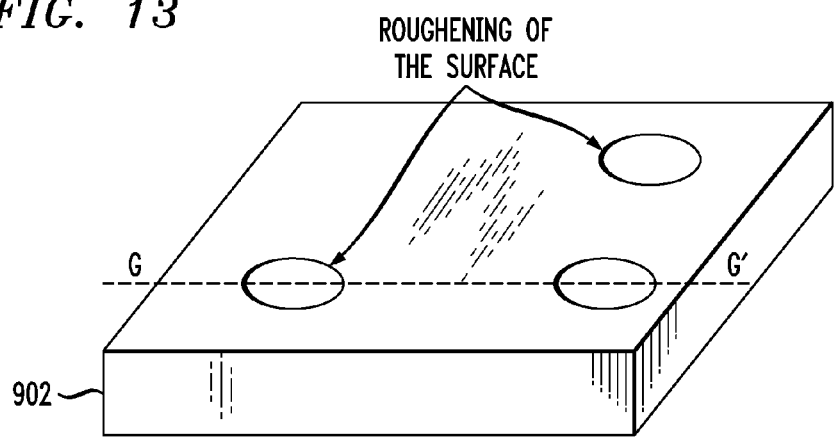
FIG. 13 is a three-dimensional diagram illustrating a wet etch process having been performed through the nanopores in the first and second diblock copolymer layers to roughen the surface of the multi-crystalline silicon layer and the diblock copolymer layers having been removed according to an embodiment of the present invention.
Figure 14:
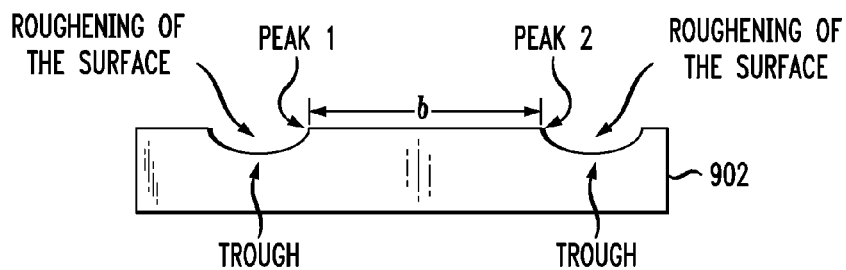
FIG. 14 is a diagram illustrating a cross-sectional cut through the multi-crystalline silicon layer which has now been roughened according to an embodiment of the present invention.

FIG. 14 depicts a cross-sectional cut through a now-roughened multi-crystalline silicon layer 902, e.g., along line G-G' (of FIG. 13). As described above, the surface roughness produced by the process depends, for example, on the particular nanopore diameter and nanopore spacing. As shown in FIG. 14, the surface roughness produced using the present techniques (e.g., a wet etch having been performed through the nanopores in the diblock copolymer layers 904 and 1102) results in a plurality of peaks and troughs having been formed on the surface of the multi-crystalline silicon layer 902. These peaks and troughs are what collectively create the surface roughness on the multi-crystalline silicon layer 902. The surface roughness corresponds to the nanopore diameter and spacing. Accordingly, a distance b from one peak (e.g., Peak 1) to an adjacent peak (e.g., Peak 2) corresponds to the nanopore spacing y. See FIG. 14. Thus according to an exemplary embodiment, the distance b from one peak to an adjacent peak on the roughened surface of the multi-crystalline silicon layer 902 is from about 80 nm to about 400 nm, e.g., from about 100 nm to about 300 nm.

As highlighted above, the present techniques may be employed in conjunction with a process for fabricating a solar cell. Namely, the present techniques provide an efficient and cost effective solution to achieve the light-trapping surface properties sought for multi-crystalline silicon photovoltaic device applications. This embodiment will now be described in detail.

The process begins with a multi-crystalline silicon substrate 1502. Suitable multi-crystalline silicon wafers are commercially available. The multi-crystalline silicon substrate 1502 is then doped with either an n-type or a p-type dopant. Suitable doping techniques include, but are not limited to, diffusion and ion implantation.

Figure 15:
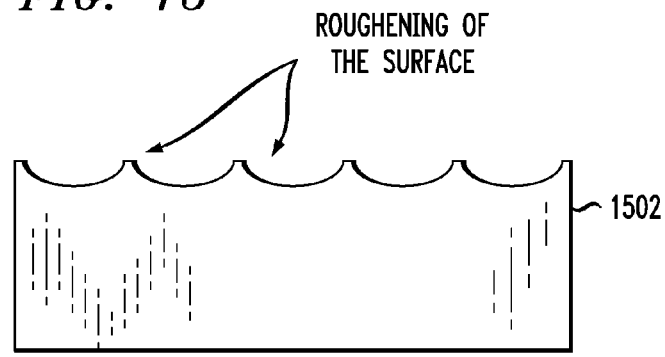
FIG. 15 is a cross-sectional diagram illustrating a top surface of a multi-crystalline silicon substrate having been roughened using the present nanopore diblock copolymer(s) method according to an embodiment of the present invention.

Next, as shown in FIG. 15, using either the single nanopore diblock copolymer embodiment (see FIGS. 1-8) or the multiple nanopore diblock copolymer embodiment (see FIGS. 9-14) a mask is created through which a wet etch is performed, thereby roughening a top surface of the multi-crystalline silicon substrate 1502. The details of forming a nanopore diblock copolymer or multiple nanopore diblock copolymer layers on a multi-crystalline silicon substrate were described above, and that description is incorporated by reference herein.

Following the wet etch, the diblock copolymer layer or layers can then be removed. The result, as shown in FIG. 15, is the multi-crystalline silicon substrate 1502 (also referred to as a base) having a roughened surface.

After roughening the top surface of the multi-crystalline silicon substrate 1502, the next step is to form a p-n junction by doping. See FIG. 16. Namely, in order to create a solar cell from the multi-crystalline silicon substrate 1502, a surface diffusion of a dopant of opposite polarity to the substrate dopant is performed on the top surface of multi-crystalline silicon substrate 1502, creating an emitter layer 1504.

Figure 16:
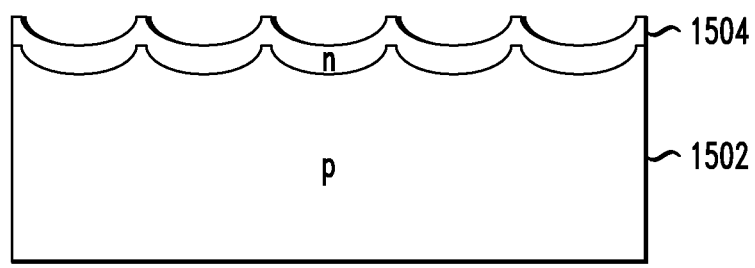
FIG. 16 is a cross-sectional diagram illustrating an emitter layer having been formed in the multi-crystalline silicon substrate using surface dopant diffusion according to an embodiment of the present invention.

For instance, if the multi-crystalline silicon substrate 1502 is doped with an n-type dopant, then the dopant employed in this step is a p-type dopant. Conversely, when the multi-crystalline silicon substrate 1502 is doped with a p-type dopant, then the dopant employed in this step is an n-type dopant. In either case, the result is the formation of a p-n junction at a depth of from about 100 nm to about 300 nm below the top surface of multi-crystalline silicon substrate 1502. For illustrative purposes only, the representation in FIG. 16 shows a p-doped multi-crystalline silicon substrate 1502 and an n-doped emitter layer 1504. However, as highlighted above, the dopants can be reversed so long as a p-n junction is formed between the layers.

Suitable doping techniques that can be used to form the emitter layer 1504 include, but are not limited to, diffusion and ion-implantation. By way of example only, when the multi-crystalline silicon substrate 1502 is p-doped, phosphoryl chloride ($POCl_3$) may be used to dope the surface of the multi-crystalline silicon substrate 1502 to create an n+ emitter layer 1504. Conversely, when the multi-crystalline silicon substrate 1502 is n-doped, boron trichloride ($BCl_3$) may be used to dope the surface of the multi-crystalline silicon substrate 1502 to create a p+ emitter layer 1504. The diffusion and treatment temperature can be from about 800° C. to about 1,000° C. for a duration of from about 20 minutes to about 90 minutes depending on the required junction depth and concentration.

Figure 17:
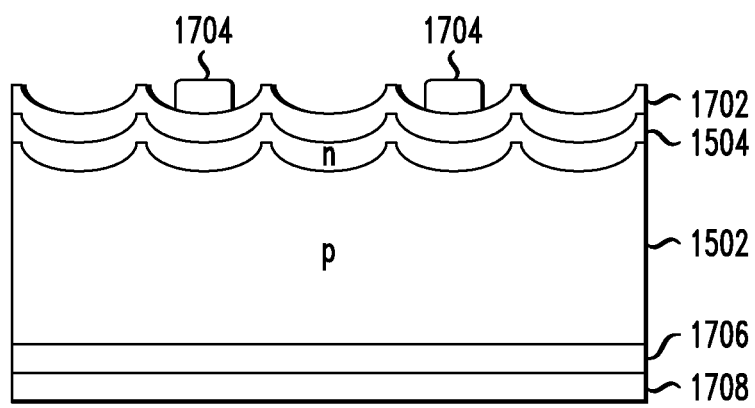
FIG. 17 is a cross-sectional diagram illustrating an antireflection coating and metal contacts having been formed on the emitter layer and an aluminum back surface field and back contact having been formed on a bottom surface of the multi-crystalline silicon substrate according to an embodiment of the present invention.

As shown in FIG. 17, an antireflection coating 1702 is formed on top of the emitter layer 1504. Antireflection coatings are used to increase the amount of light coupled into the solar cell. Suitable materials for use in forming the antireflection coating 1702 include, but are not limited to, silicon nitride (SiN) and titanium dioxide ($TiO_2$). According to an exemplary embodiment, the antireflection coating 1702 is deposited on the emitter layer 1504 using plasma-enhanced chemical vapor deposition (PECVD) to a thickness of from about 200 nm to about 400 nm. Since the emitter layer 1504 and antireflection coating 1702 are conformal layers, the surface roughness from the multi-crystalline silicon substrate 1502 is carried therethrough.

Top metal contacts 1704 are then formed on antireflection coating 1702. The metal contacts may be configured in a grid pattern and may be formed from metals such as nickel and platinum using a screen-printing process as is known in the art.

As shown in FIG. 17, an aluminum back surface field 1706 is formed on a bottom surface of the multi-crystalline silicon substrate 1502. According to an exemplary embodiment, aluminum back surface field 1706 is deposited on the multi-crystalline silicon substrate 1502 using evaporation, PECVD or atomic layer deposition (ALD) to a thickness of from about 100 nm to about 300 nm.

Finally, as shown in FIG. 17, a back contact 1708 is formed on a side of the aluminum back surface field 1706 opposite the multi-crystalline silicon substrate 1502. Suitable materials for use in forming the back contact 1708 include, but are not limited to, aluminum. According to an exemplary embodiment, the back contact 1708 is deposited on the aluminum back surface field 1706 using low pressure chemical vapor deposition (LPCVD), PECVD or solid-phase crystallization (SPC) to a thickness of from about 100 nm to about 300 nm.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for roughening a multi-crystalline silicon surface, comprising the steps of:
   coating the multi-crystalline silicon surface with a first diblock copolymer layer;
   annealing the first diblock copolymer layer to form nanopores therein;
   spin-coating one or more second diblock copolymer layers onto the first diblock copolymer layer, after the first diblock copolymer layer has been annealed, to form a stack of diblock copolymer layers on the surface of the multi-crystalline silicon substrate;
   annealing the one or more second diblock copolymer layers to form nanopores therein, wherein a number of the diblock copolymer layers employed in the stack is based on a desired nanopore spacing between the nanopores formed in the first diblock copolymer layer that line up with the nanopores formed in the one or more second diblock copolymer layers and thus provide through-extending nanopores in the stack which extend through both the first diblock copolymer layer and each of the one or more second diblock copolymer layers, and wherein by increasing the number of the diblock copolymer layers in the stack the nanopore spacing is increased since only a fraction of the nanopores formed in the first diblock copolymer layer will line up with the nanopores in each of the one or more second diblock copolymer layers;
   etching the multi-crystalline silicon surface through the through-extending nanopores in the stack to roughen the multi-crystalline silicon surface; and
   removing the first diblock copolymer layer and the one or more second diblock copolymer layers from the surface of the multi-crystalline silicon substrate.

2. The method of claim 1, wherein the first diblock copolymer layer is spin-coated on the surface.

3. The method of claim 1, wherein the first diblock copolymer layer and the one or more second diblock copolymer layers are each annealed at a temperature of from about 150° C. to about 240° C., for a duration of from about 24 hours to about 48 hours.

4. The method of claim 1, wherein the first diblock copolymer layer and the one or more second diblock copolymer layers are each formed from a material selected from the group consisting of Polystyrene-b-poly(ethylene oxide), PS-b-PEO, Polystyrene-poly(methyl methacrylate) and PS-b-PMMA.

5. The method of claim 1, wherein the multi-crystalline silicon surface is etched using a wet etching process.

6. The method of claim 5, wherein the wet etching process comprises an acid etch performed using a $HF:HNO_3:H_2O$ solution.

7. The method of claim 1, wherein a spacing between adjacent nanopores in the first diblock copolymer layer is from about 20 nm to about 40 nm.

8. The method of claim 1, wherein each of the nanopores in the first diblock copolymer layer and each of the nanopores in the one or more second diblock copolymer layers has a diameter of from about 6 nm to about 40 nm.

9. The method of claim 1, wherein each of the nanopores in the first diblock copolymer layer and each of the nanopores in the one or more second diblock copolymer layers has a diameter of from about 10 nm to about 30 nm.

10. A method for fabricating a solar cell, comprising the steps of:
    providing a multi-crystalline silicon substrate;
    coating a surface of the multi-crystalline silicon substrate with a first diblock copolymer layer;
    annealing the first diblock copolymer layer to form nanopores therein;
    spin-coating one or more second diblock copolymer layers onto the first diblock copolymer layer, after the first diblock copolymer layer has been annealed, to form a stack of diblock copolymer layers on the surface of the multi-crystalline silicon substrate;
    annealing the one or more second diblock copolymer layers to form nanopores therein, wherein a number of the diblock copolymer layers employed in the stack is based on a desired nanopore spacing between the nanopores formed in the first diblock copolymer layer that line up with the nanopores formed in the one or more second diblock copolymer layers and thus provide through-extending nanopores in the stack which extend through both the first diblock copolymer layer and each of the one or more second diblock copolymer layers, and wherein by increasing the number of the diblock copolymer layers in the stack the nanopore spacing is increased since only a fraction of the nanopores formed in the first diblock copolymer layer will line up with the nanopores in each of the one or more second diblock copolymer layers;
    etching the surface of the multi-crystalline silicon substrate through the through-extending nanopores in the stack resulting in a roughened surface;
    removing the first diblock copolymer layer and the one or more second diblock copolymer layers from the surface of the multi-crystalline silicon substrate;
    forming a conformal emitter layer on the roughened surface of the multi-crystalline silicon substrate through surface diffusion of a dopant into the roughened surface of the multicrystalline silicon substrate; and
    forming a conformal antireflection coating on the emitter layer, wherein by the emitter layer and the antireflection coating both being conformal layers a surface roughness from the roughened surface of the multi-crystalline silicon substrate is carried through both the emitter layer and the antireflection coating.

11. The method of claim 10, wherein the multi-crystalline silicon substrate is doped with either an n-type or a p-type dopant.

12. The method of claim 11, wherein the emitter layer is doped with either (i) a p-type dopant if the multi-crystalline silicon substrate is doped with an n-type dopant, or (ii) an n-type dopant if the multi-crystalline silicon substrate is doped with a p-type dopant.

13. The method of claim 10, wherein the first diblock copolymer layer is spin-coated on the surface.

14. The method of claim 10, wherein the first diblock copolymer layer and the one or more second diblock copolymer layers are each annealed at a temperature of from about 150° C. to about 240° C., for a duration of from about 24 hours to about 48 hours.

15. The method of claim 10, wherein the first diblock copolymer layer and the one or more second diblock copolymer layers are each formed from a material selected from the group consisting of Polystyrene-b-poly(ethylene oxide), PS-b-PEO, Polystyrene-poly(methyl methacrylate) and PS-b-PMMA.

16. The method of claim 10, wherein the surface of the multi-crystalline silicon substrate is etched using a wet etching process.

17. The method of claim 16, wherein the wet etching process comprises an acid etch performed using a $HF:HNO_3:H_2O$ solution.

18. The method of claim 10, further comprising the step of:
forming metal contacts on the antireflection coating.

19. The method of claim 1, wherein a spacing between adjacent through-extending nanopores in the stack is from about 100 nm to about 300 nm.

20. The method of claim 1, wherein the step of removing the first diblock copolymer layer and the one or more second diblock copolymer layers from the surface of the multi-crystalline silicon substrate comprises the steps of:
exposing the first diblock copolymer layer and the one or more second diblock copolymer layers to a hydrogen or forming gas plasma to weaken the first diblock copolymer layer and the one or more second diblock copolymer layers; and
following the exposing step, wet etching the first diblock copolymer layer and the one or more second diblock copolymer layers.

* * * * *